United States Patent
Treibergs et al.

(10) Patent No.: US 9,829,506 B2
(45) Date of Patent: Nov. 28, 2017

(54) TEST PROBE ASSEMBLY AND RELATED METHODS

(71) Applicant: XCERRA CORPORATION, Norwood, MA (US)

(72) Inventors: Valts Treibergs, Norwood, MA (US); Aaron Magnuson, Norwood, MA (US); Sergey Yakushev, Norwood, MA (US); Scott Hanson, Norwood, MA (US)

(73) Assignee: Xcerra Corporation, Norwood, MA (US)

( * ) Notice: Subject to any disclaimer, the term of this patent is extended or adjusted under 35 U.S.C. 154(b) by 61 days.

(21) Appl. No.: 14/394,252

(22) PCT Filed: Mar. 14, 2013

(86) PCT No.: PCT/US2013/031240
§ 371 (c)(1),
(2) Date: Oct. 13, 2014

(87) PCT Pub. No.: WO2013/154738
PCT Pub. Date: Oct. 17, 2013

(65) Prior Publication Data
US 2015/0070040 A1    Mar. 12, 2015

Related U.S. Application Data

(60) Provisional application No. 61/624,083, filed on Apr. 13, 2012.

(51) Int. Cl.
*G01R 1/067* (2006.01)
*G01R 1/04* (2006.01)
*G01R 3/00* (2006.01)

(52) U.S. Cl.
CPC .......... *G01R 1/0416* (2013.01); *G01R 1/067* (2013.01); *G01R 1/06705* (2013.01);
(Continued)

(58) Field of Classification Search
CPC .......... G01R 1/0416; G01R 3/00; G01R 1/067
See application file for complete search history.

(56) References Cited

U.S. PATENT DOCUMENTS 5,936,421 A * 8/1999 Stowers ................ G01R 15/12
324/750.27
6,033,233 A    3/2000 Haseyama et al.
(Continued)

FOREIGN PATENT DOCUMENTS

JP    2011232181 A * 11/2011
JP    2011232181 A    11/2011
(Continued)

OTHER PUBLICATIONS

Multitest, "MER030 Design Disclosure, Test Probe Interconnect with Improved Biasing and Retention Feature", Jan. 6, 2012, V2.0.
(Continued)

*Primary Examiner* — Giovanni Astacio-Oquendo
*Assistant Examiner* — Alvaro Fortich
(74) *Attorney, Agent, or Firm* — Viksnins Harris Padys Malen LLP

(57) ABSTRACT

A test probe assembly includes a first elongate electrically conductive plunger that extends from a proximal first plunger end to a distal first plunger end, and is defined in part by a central longitudinal axis. The first plunger has a first spring latch at the distal first plunger end. At least a portion of the first plunger has an arc with a first plunger outer contact point opposite the first spring latch relative to the longitudinal axis. The first plunger is disposed in a spring. The first plunger outer contact point in contact with the inner diameter of the spring, and the first spring latch engages at least a portion of the spring. A method includes disposing a first plunger within a spring along a spring longitudinal axis, disposing a second probe within the spring along the spring longitudinal axis, and engaging the spring latch and the
(Continued)

second plunger spring latch with the spring, for instance by capturing an end coil of the spring with the spring latch of at least one of the spring latch or the second plunger spring latch.

22 Claims, 20 Drawing Sheets

(52) U.S. Cl.
CPC .......... *G01R 1/06722* (2013.01); *G01R 3/00* (2013.01); *Y10T 29/49119* (2015.01)

(56) References Cited

U.S. PATENT DOCUMENTS

| | | | | |
|---|---|---|---|---|
| 6,053,777 | A * | 4/2000 | Boyle | G01R 1/06 439/482 |
| 6,506,082 | B1 * | 1/2003 | Meek | H01R 13/2421 439/700 |
| 6,746,252 | B1 | 6/2004 | Scott | |
| 7,862,391 | B2 * | 1/2011 | Johnston | H01R 13/2421 439/66 |
| 8,721,372 | B2 * | 5/2014 | Hasegawa | G01R 1/0483 439/66 |
| 2005/0110505 | A1 * | 5/2005 | Stanley Tsui | G01R 1/06733 324/755.05 |
| 2006/0279301 | A1 * | 12/2006 | Treibergs | G01R 1/0466 324/754.05 |
| 2008/0252326 | A1 * | 10/2008 | Watanabe | G01R 1/06722 324/755.05 |
| 2009/0075529 | A1 * | 3/2009 | Johnston | H01R 13/2421 439/824 |
| 2009/0280676 | A1 * | 11/2009 | Weiland | G01R 1/06733 439/482 |
| 2010/0197176 | A1 * | 8/2010 | Swart | G01R 1/06738 439/816 |
| 2011/0039457 | A1 * | 2/2011 | Johnston | H01R 13/2421 439/816 |
| 2011/0175636 | A1 * | 7/2011 | Swart | G01R 1/06722 324/755.05 |
| 2011/0275229 | A1 * | 11/2011 | Lin | H01R 13/2421 439/68 |

FOREIGN PATENT DOCUMENTS

| | | |
|---|---|---|
| JP | 2012068134 A | 4/2012 |
| WO | 2011036935 A1 | 3/2011 |

OTHER PUBLICATIONS

Patent Cooperation Treaty, International Searching Authority, International Search Report and Written Opinion for PCT/US2013/031240, 8 pages, dated Jul. 11, 2013.

* cited by examiner

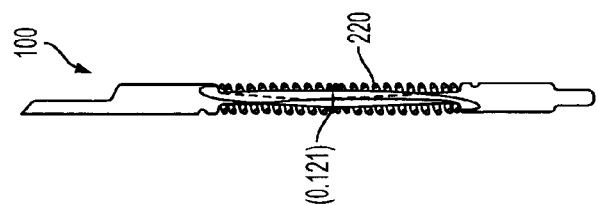
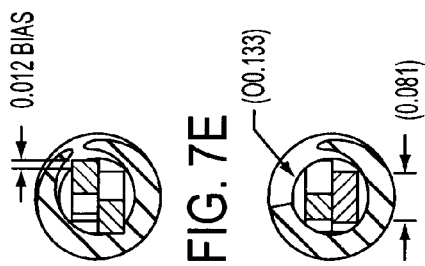
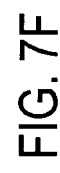
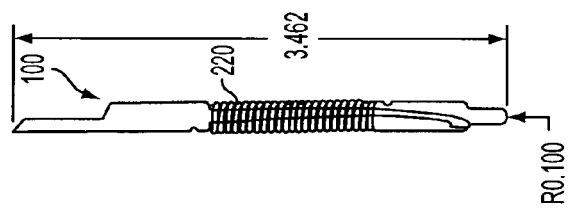
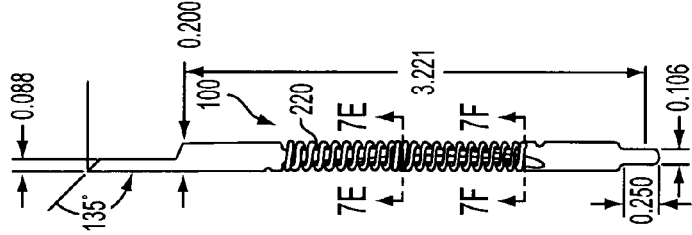
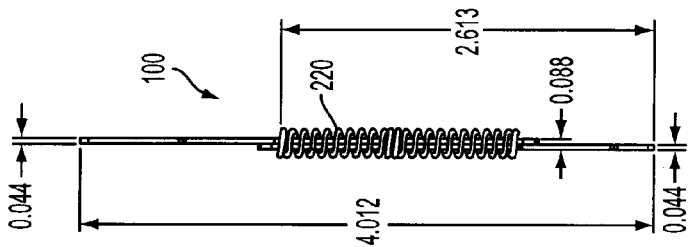
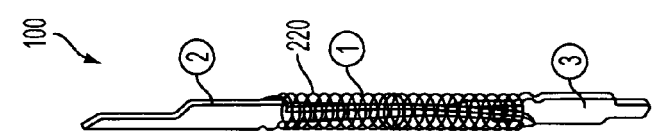
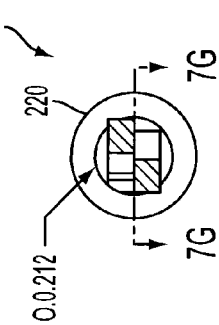

TEST PROBE ASSEMBLY AND RELATED METHODS

RELATED APPLICATION

This applications claims priority under 35 USC 119(e) to provisional application U.S. Ser. No. 61/624,083 filed 13 Apr. 2012, which application is incorporated herein by reference.

TECHNICAL FIELD

Spring contact assemblies and assemblies useful for test probes and related methods.

TECHNICAL BACKGROUND

Conventional spring loaded contact probes generally include a movable plunger and a barrel having an open end for containing an enlarged diameter section of the plunger, and a spring for biasing the travel of the plunger in the barrel. The plunger bearing slidably engages the inner surface of the barrel. The enlarged bearing section is retained in the barrel by a crimp, swage, or roll near the barrel open end. The plunger is commonly biased outwardly, a selected distance by the spring and may be biased or depressed inwardly into the barrel, a selected distance, under force directed against the spring. Axial and side biasing of the plunger against the barrel prevents false opens or intermittent points of no contact between the plunger and the barrel. The plunger generally is solid and includes a head or tip for contacting electrical devices under test. The barrel may also include a tip opposite the barrel's open end.

The barrel, plunger and tips form an electrical interconnect between the electrical device under test and test equipment and as such, are manufactured from an electrically conductive material. Typically the probes are fitted into cavities formed through the thickness of a test plate or socket. Generally a contact side of the electrical device to be tested, such as an integrated circuit, is brought into pressure contact with the tips of the plungers protruding through one side of the test plate or test socket for manufacturing spring pressure against the electrical device. A contact plate connected to the test equipment is brought to contact with the tips of the plungers protruding from the other side of the test plate or test socket. The test equipment transmits signals to the contact plate from where they are transmitted through the test probe interconnects to the device being tested. After the electrical device has been tested, the pressure exerted by the spring probes is released and the device is removed from contact with the tip of each probe.

The process of making conventional spring probes involves separately producing the compression spring, the barrel and the plunger. The compression spring is commonly wound and heat treated to produce a spring of a precise size and of a controlled spring force. The plunger is typically turned on a lathe and heat treated. The barrels are also sometimes heat treated. The barrels can be formed in a lathe or by a deep draw process. All components may be subjected to a plating process to enhance conductivity. The spring probe components are assembled either manually or by an automated process.

An important aspect of testing integrated circuits is that they are tested under high frequencies. As such impedance matching is required between the test equipment and the integrated circuit so as to avoid attenuation of the high frequency signals. Considering that spacing within a test socket is minimal, in order to avoid attenuation of the high frequency signals, the length of the electrical interconnect formed by the probes must be kept to a minimum. To address this problem external spring probes have been developed having a shorter length than conventional probes. External spring probes consist of two separate sections each having a tip and a flange. A contact component extends from each probe section opposite the tip. The two contact components contact each other and the spring is sandwiched between two flanges that surround the contact components. Typically the first contact component is a barrel while the second contact component is a bearing surface. The bearing surface is slidably engaged to the inner surface of the barrel. These probes are fitted into cavities formed in the test sockets used during testing. A problem associated with these type of external spring probes is the expense to manufacture due to costly machining operations.

In response, external spring probes were designed having flat components which can be produced less expensively by stamping or other profile cutting methods. Typically these designs incorporate two components which are connected orthogonally and the electrical path between the two components is through a protruding end surface. A problem with this design is that the components wear out rather quickly and have a short life span requiring constant replacement.

SUMMARY

A test probe assembly includes a first elongate electrically conductive plunger that extends from a proximal first plunger end to a distal first plunger end, and is defined in part by a central longitudinal axis. The first plunger has a first spring latch at the distal first plunger end. At least a portion of the first plunger has an arc with a first plunger outer contact point opposite the first spring latch relative to the longitudinal axis. The first plunger is disposed in a spring. The first plunger outer contact point in contact with the inner diameter of the spring, and the first spring latch engages at least a portion of the spring. Optionally a second plunger is disposed within the spring, adjacent to the first plunger, where the second plunger has an outer contact point in contact with the inner diameter of the spring, and the second plunger has a spring latch that engages at least a portion of the spring.

A method includes assembling a testing apparatus including the test probe assemblies discussed above. The method can further or alternatively include using the test probe assembly, for example, within a testing apparatus. In an embodiment, the method includes disposing a first plunger within a spring along a spring longitudinal axis, where the first plunger extends from a proximal first plunger end to a distal first plunger end and has a first intermediate portion therebetween. The first plunger has a spring latch at the distal first plunger end.

The method further includes disposing a second probe within the spring along the spring longitudinal axis, where the second elongate plunger extends from a proximal second plunger end to a distal second plunger end and has a second plunger spring latch at the distal second plunger end. The method further includes engaging the spring latch and the second plunger spring latch with the spring.

These and other embodiments, aspects, advantages, and features of the present invention will be set forth in part in the description which follows, and will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

BRIEF DESCRIPTION OF THE FIGURES

FIG. 7A is a perspective view of a test probe assembly in a first position according to one or more embodiments.

FIG. 7B is a first side view of a test probe assembly in the first position according to one or more embodiments.

FIG. 7C is a second side view of a test probe assembly in the first position according to one or more embodiments.

FIG. 7D is a side view of a test probe assembly in the second position according to one or more embodiments.

FIG. 7E is a cross sectional view of the test probe assembly taken along 7E-7E of FIG. 7C.

FIG. 7F is a cross sectional view of the test probe assembly taken along 7F-7F of FIG. 7C.

FIG. 7G is a cross sectional view of the test probe assembly taken along 7G-7G of FIG. 7H.

FIG. 7H is a top view of the test probe assembly of FIG. 7C.

DETAILED DESCRIPTION

The following detailed description includes references to the accompanying drawings, which form a part of the detailed description. The drawings show, by way of illustration, specific embodiments in which the apparatus may be practiced. These embodiments, which are also referred to herein as "examples" or "options," are described in enough detail to enable those skilled in the art to practice the present embodiments. The embodiments may be combined, other embodiments may be utilized or structural or logical changes may be made without departing from the scope of the invention. The following detailed description is, therefore, not to be taken in a limiting sense and the scope of the invention is defined by the appended claims and their legal equivalents.

In this document, the terms "a" or "an" are used to include one or more than one, and the term "or" is used to refer to a nonexclusive "or" unless otherwise indicated. In addition, it is to be understood that the phraseology or terminology employed herein, and not otherwise defined, is for the purpose of description only and not of limitation.

A test apparatus having a test probe interconnect assembly with improved biasing and retention is described herein. It includes a coil spring based compliant electrical probe that is used, for example, for semiconductor testing. The probe can be disposed in a test apparatus housing such as a plastic housing.

An example of the test probe interconnect is a test probe assembly 100 that includes one or more plungers or probes disposed within a spring, such as, but not limited to, a helical compression spring.

Figure 2:
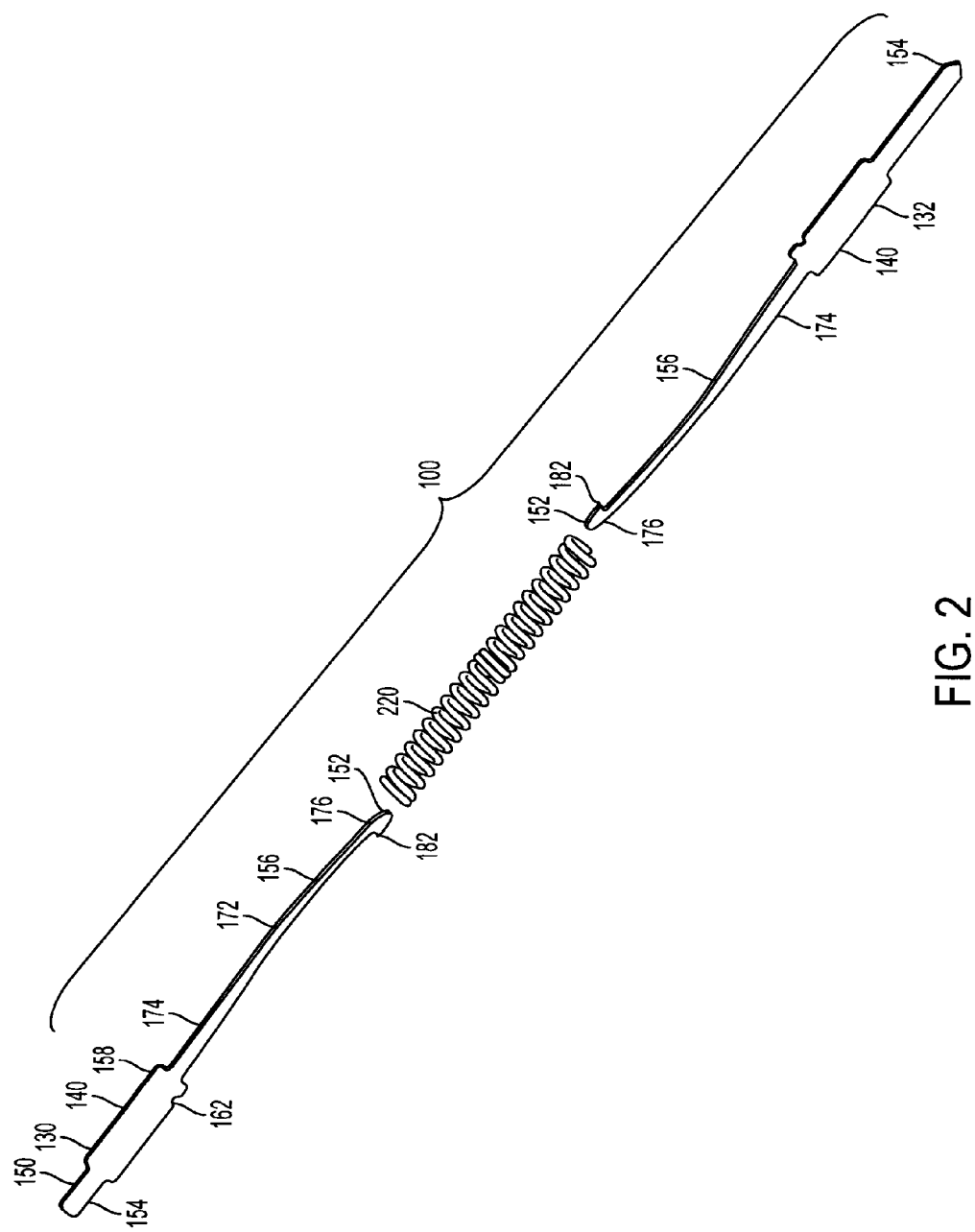
FIG. 2 is an exploded perspective view of a test probe assembly according to one or more embodiments.
Figure 3:
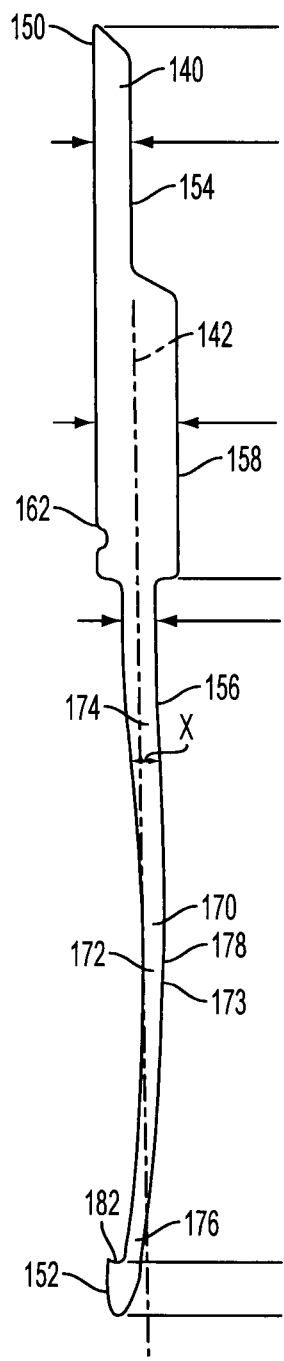
FIG. 3 is a side view of a test probe plunger according to one or more embodiments.

A plunger 140 is illustrated in FIGS. 2-3 in greater detail. The plunger 140 is defined in part by a central longitudinal axis 142 which extends down through a central region of the component when the plunger 140 is viewed in the side view. The plunger 140 extends from a proximal end 150 to a distal end 152. The proximal end 150 includes a first structure 154 includes a tapered end. The tapered ends can have a variety of configurations such as, but not limited to, those shown in FIGS. 4C, 7D. The first structure 154 is used for contacting test contacts during the testing process.

Disposed toward an intermediate portion 156 of the plunger 140, between the proximal end and the intermediate portion 156, is a second structure 158 that has a second width. In an embodiment, the second structure 158 is generally centered along the longitudinal axis 142 of the plunger 140. The second structure 158 optionally includes orientation component 162. In an option, the orientation component 162 is a notch, such as a semi-circular notch that indicates to a user correct orientation of the component during assembly of the test probe assembly 100.

Figure 6:
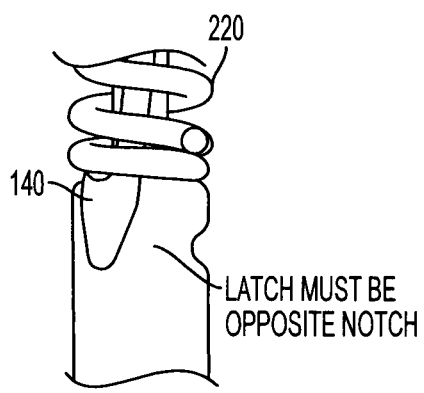
FIG. 6 is a side view of a portion of a test probe assembly according to one or more embodiments.

The plunger 140 further includes a bias structure 170. In an option, the bias structure 170 is an arc 172 that extends from a first arc end portion 174 to a second arc end portion 176. At the distal end 152 of the plunger 140 is a latch 182, such as a spring latch. The latch 182 has a structure that receives an end portion of a spring, such an end coil of a coil spring 220, as shown in FIG. 6. In an option, the latch 182 has a hook structure formed between the curve 172 and the distal end 152. The hook structure, in an embodiment, forms a ledge disposed at approximately a right angle relative to the longitudinal axis 142.

Figure 9A:
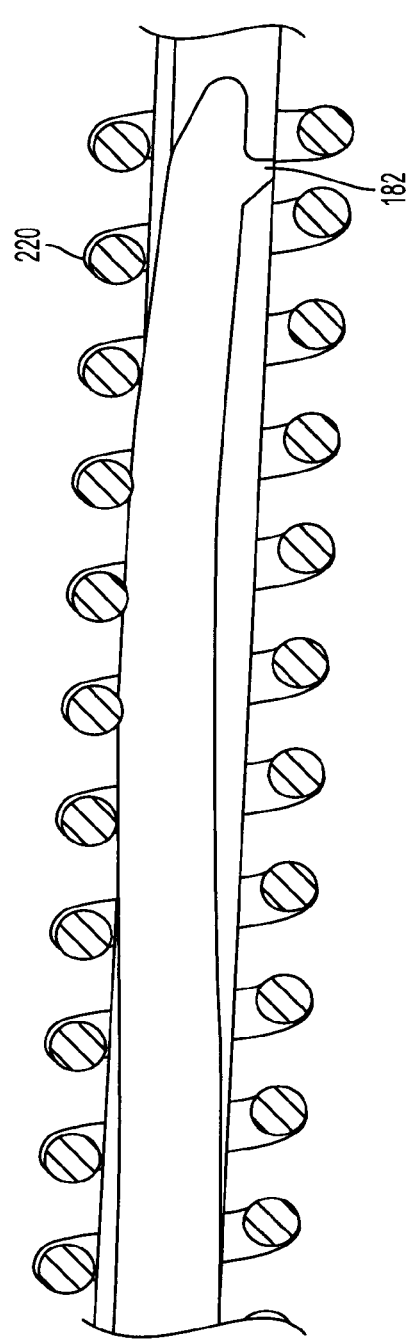
FIG. 9A is a cross sectional view of a test probe assembly according to one or more embodiments.
Figure 9B:
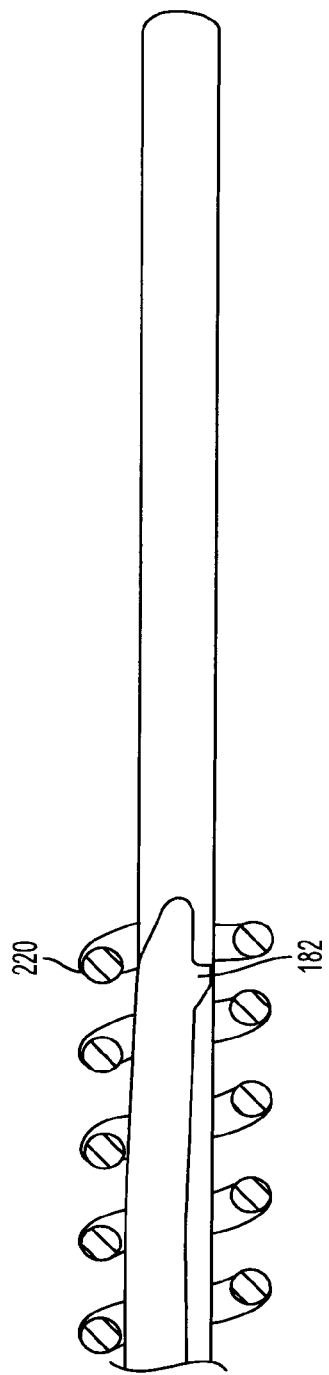
FIG. 9B is a cross sectional view of a test probe assembly according to one or more embodiments.
Figure 10B:
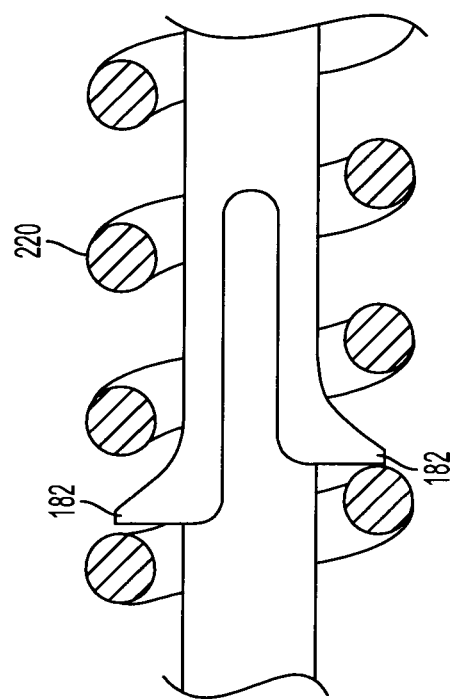
FIG. 10B is an enlarged cross sectional view of a test probe assembly according to one or more embodiments.
Figure 10A:
FIG. 10A is a cross sectional view of a test probe assembly according to one or more embodiments.
Figure 11A:
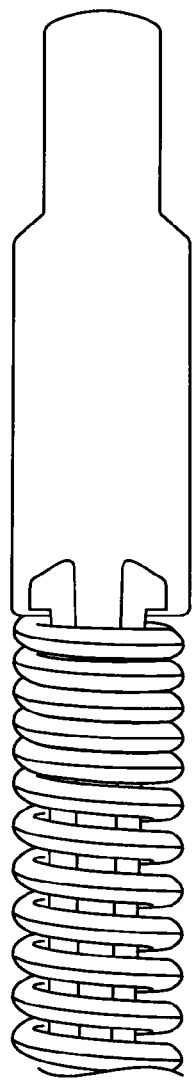
FIG. 11A is a side view of a portion of a test probe assembly in a first position according to one or more embodiments.
Figure 11B:
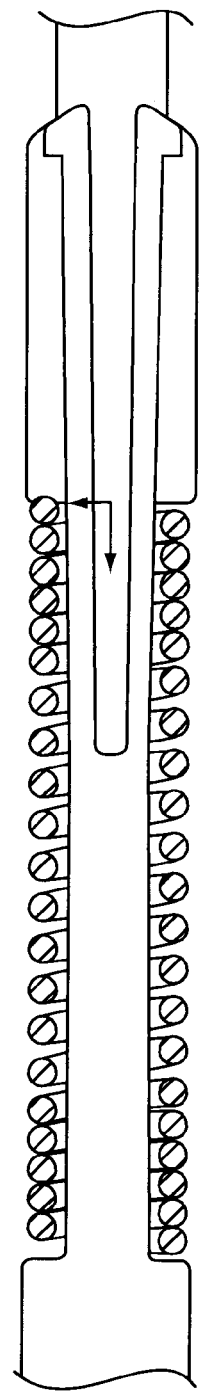
FIG. 11B is a cross-sectional view of a portion of a test probe assembly in a second position according to one or more embodiments.

In another embodiment, the latch 182 is shown in FIGS. 9A and 9B, and the latch 182 engages an intermediate portion of the spring 220. The latch 182 is an outwardly protruding hook. This can be used with other types of springs, such as a helical extension spring. In another option, the latch 182 includes outwardly protruding flexible hooks, as shown in FIGS. 10A and 10B which can also be used with a helical extension spring. In yet another option, as shown in FIGS. 11A and 11B, a pair of outwardly protruding flexible hooks clips over and end coils of a coil spring.

Figures 12A, 12B:
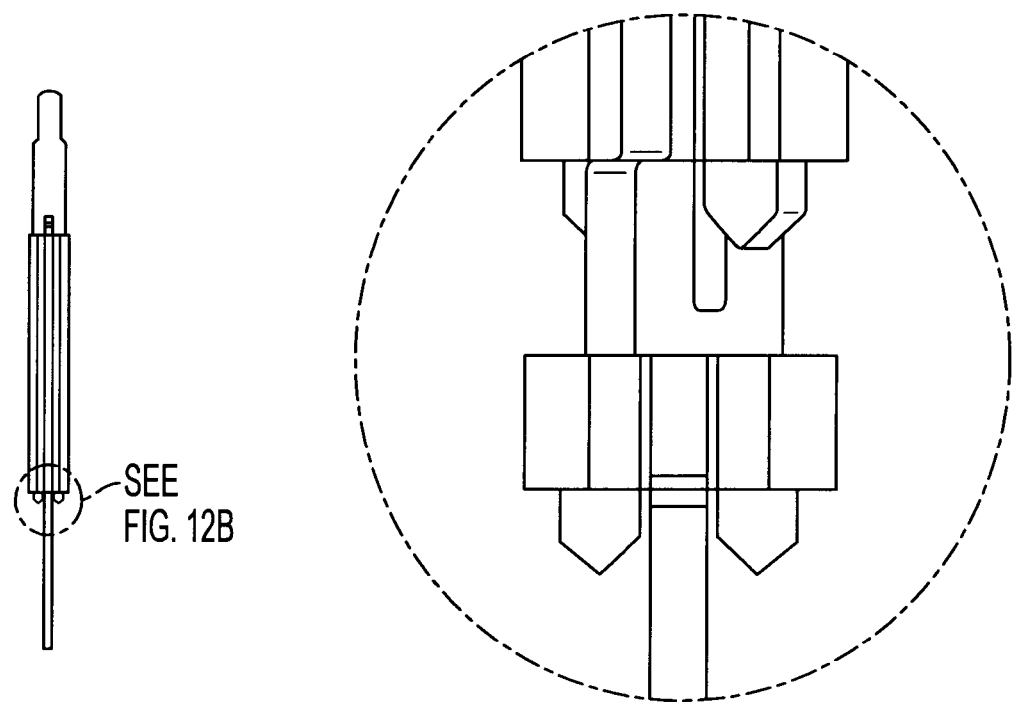
FIG. 12A is a side view of a test probe assembly according to one or more embodiments.
FIG. 12B is an enlarged view of a test probe assembly according to one or more embodiments.
Figure 12C:
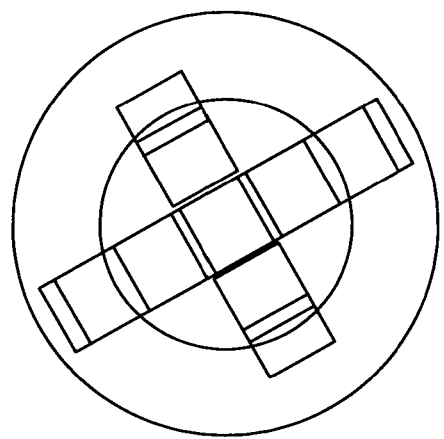
FIG. 12C is an end view of a test probe assembly according to one or more embodiments.

In yet another option, as shown in FIGS. 12A-12C, the plungers are disposed generally perpendicular relative to one another, rather than parallel as in the previous embodiments. The plungers of FIGS. 12A-12C include a latch, such as an outwardly protruding hook which engages or hooks onto the coil spring.

The bias structure 170 of the arc 172 further includes a plunger outer contact point 173 opposite the latch 182 relative to the longitudinal axis 142. The bias structure 170 biases the plunger 140 to a position where the latch 182 can engage the spring 220, for example, via the outer contact point 173.

Figure 1A:
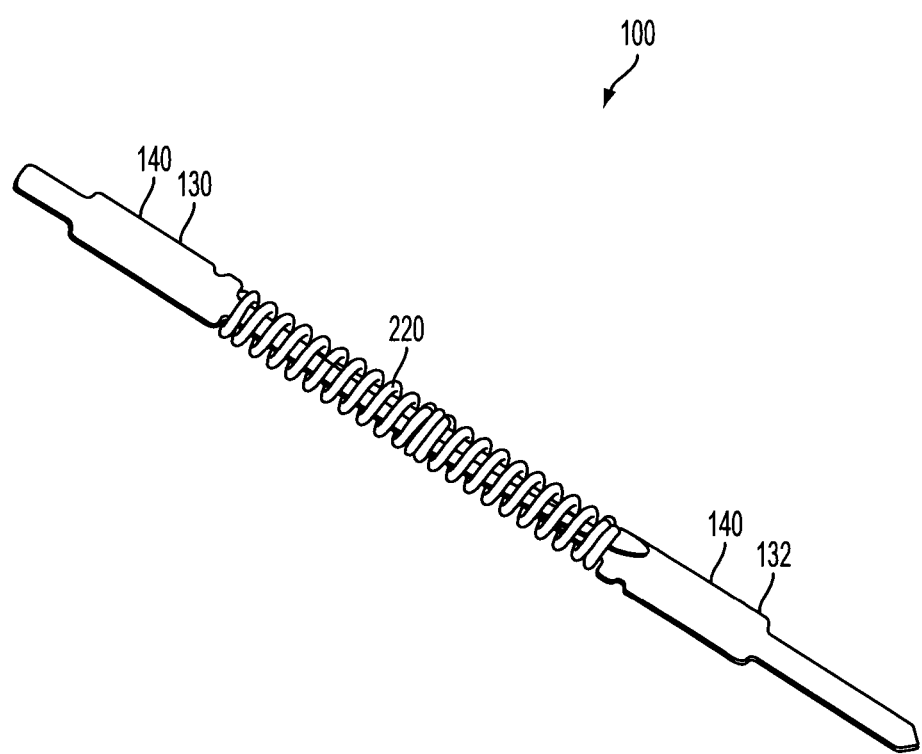
FIG. 1A is a perspective view of a test probe assembly in a first position according to one or more embodiments.
Figure 5:
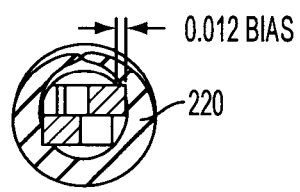
FIG. 5 is a cross sectional view of the test probe assembly taken along 5-5 of FIG. 4B.

In another embodiment, the plunger and the inner dimension of the coil spring have dimensions that maximize the contact and/or interference of the plunger with the coil spring. The plunger 140 has a thickness of about 0.04-0.05 mm. In an embodiment, multiple plungers 140 are disposed within the coil spring 220, such as two plungers, and their collective thickness is greater than about 0.08 mm. In an embodiment, the arc 172 has an outer portion 178 that is spaced at a distance of x from the longitudinal axis 142. In an option, the dimension x has a range of about 0.05-0.07 mm. In another option, the dimension x is approximately equal to or greater than the radius of the internal dimension of a component into which the plunger 140 is inserted. For instance, the plunger 140 is disposed in a coil spring 220 (FIG. 1A). The coil spring 220 has an internal diameter of 2 r, and the dimension x is approximately equal to or greater than r. The dimension x of curve 172, when the plunger 140 is disposed within the coil spring 220, allows for at least a portion of the plunger 140 to be biased toward a direction 180 from the outer portion 178 toward to the longitudinal axis 142. In an embodiment, the dimension x is in the range of 0.06-0.07 mm, and r of the spring 220 is in the range of 0.06-0.07 mm. In another embodiment, the plunger outer contact point is in contact with the inner diameter of the spring, either directly or indirectly, and causes the plunger to bias and engage at least a portion of the spring. In an embodiment, the amount of bias of the plunger is about 0.012 mm, as shown in FIG. 5, or in the range of 0.005-0.020 mm.

Figure 1B:
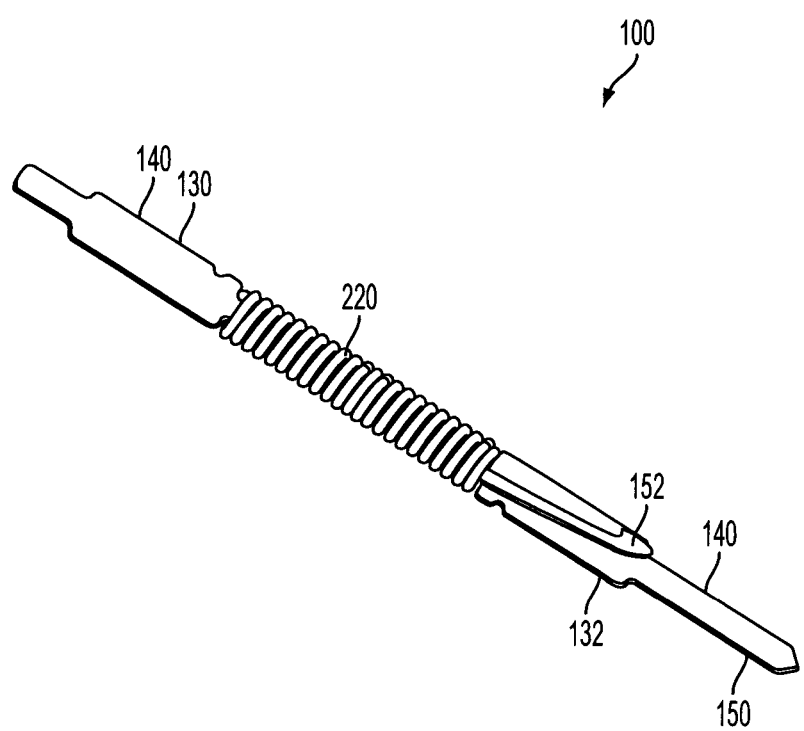
FIG. 1B is a perspective view of a test probe assembly in a second position according to one or more embodiments.
Figure 4A:
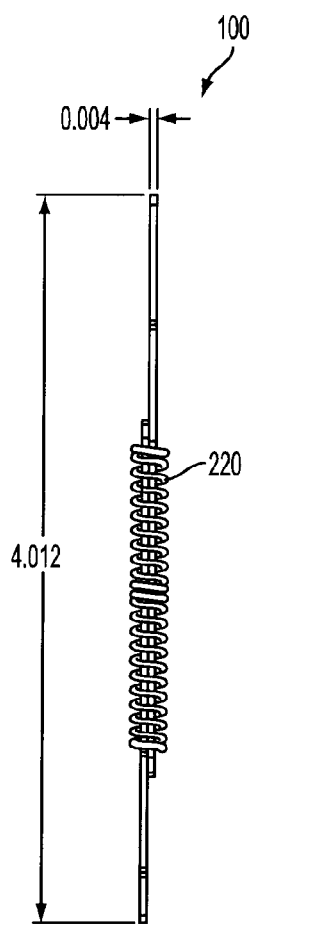
FIG. 4A is a first side view of a test probe assembly in the first position according to one or more embodiments.
Figure 4B:
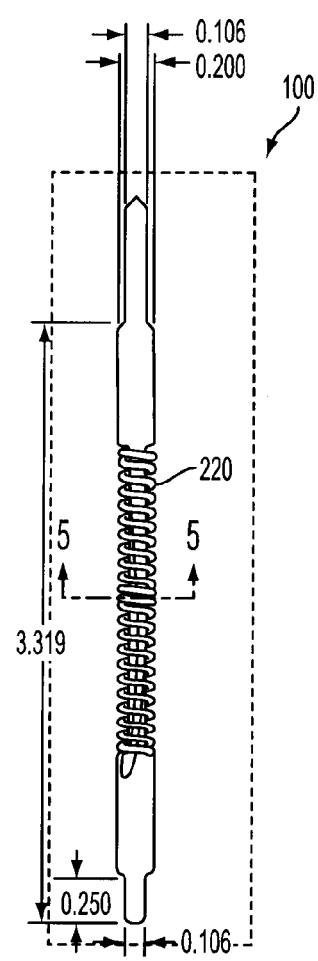
FIG. 4B is a second side view of a test probe assembly in the first position according to one or more embodiments.
Figure 4C:
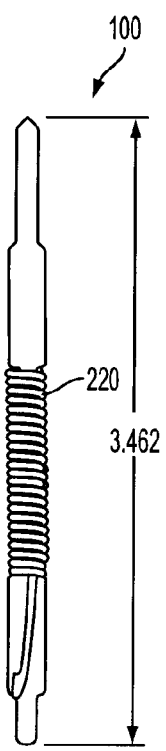
FIG. 4C is a side view of a test probe assembly in the second position according to one or more embodiments.

Referring again to FIGS. 1A, 1B, and 2, the assembly includes two or more components, such as two plungers 140 as shown. The two or more plungers slidably engage one another while disposed within a spring. The plungers 140 include a first plunger 130, and a second plunger 132 that are disposed adjacent and parallel to one another, and slide against each other during use of the testing apparatus. The first and second plungers 130, 132 are disposed within the spring 220, such as a coil spring, where the spring 220 is defined by an internal diameter. The first and second plungers 130, 132 are oriented relative to one another such that a distal end 152 of the first plunger 130 is disposed toward the proximal end 150 of the second plunger 132, as shown in FIGS. 4A, 4B, and 4C. One or more of the plungers 140, or each of the plungers 140, include an engagement feature, such as a hook that latches on the outer coil on each side of the spring. In the free, uncompressed state, as shown in FIGS. 4A, 4B, 7A, 7B, 7C, the engagement feature of the components retain the assembly of the test probe assembly. For instance, each of the first plunger 130 spring latch and the second plunger 132 spring latch engages at least a portion of the spring, such as the end coil of the spring.

Figure 8:
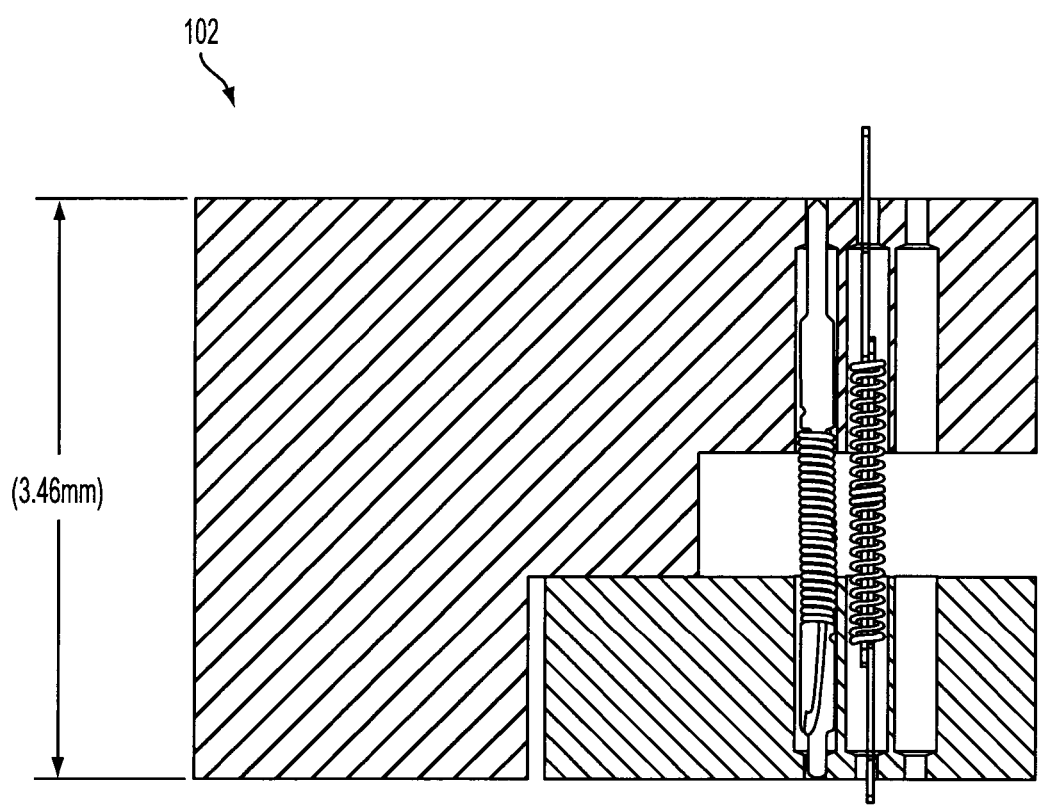
FIG. 8 is a cross sectional view of a testing apparatus according to one or more embodiments.

To test a component, for instance in a testing apparatus 102 as shown in FIG. 8, the plungers 140 are compressed toward one another, as shown in FIGS. 4C, 7D and contact of the components can occur.

Figure 13:
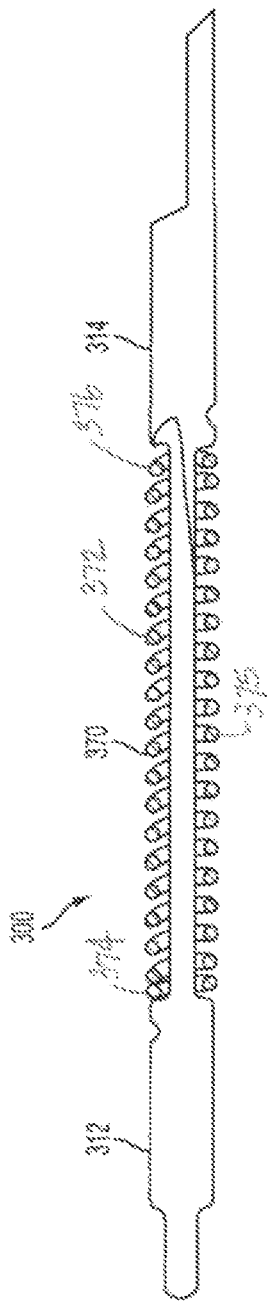
FIG. 13 illustrates a cross-sectional view of a test probe assembly in an uncompressed state according to one or more embodiments.
Figure 14:
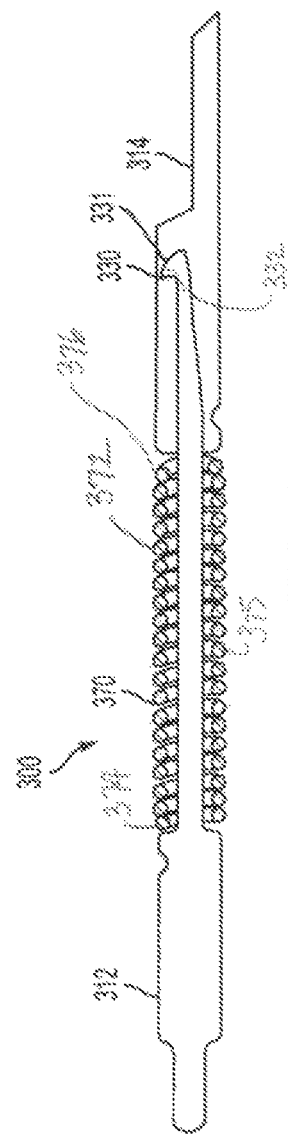
FIG. 14 illustrates a cross-sectional view of a test probe assembly in a compressed state according to one or more embodiments.
Figure 15A:
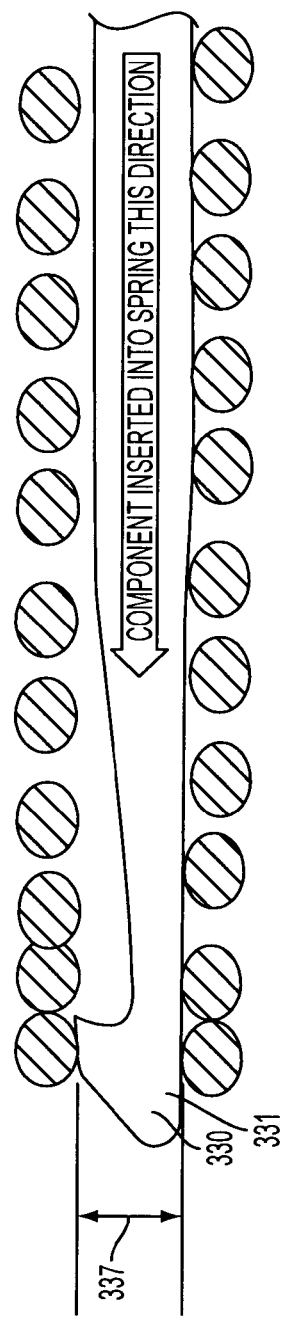
FIG. 15A illustrates a cross-sectional view of a test probe assembly according to one or more embodiments.
Figure 15B:
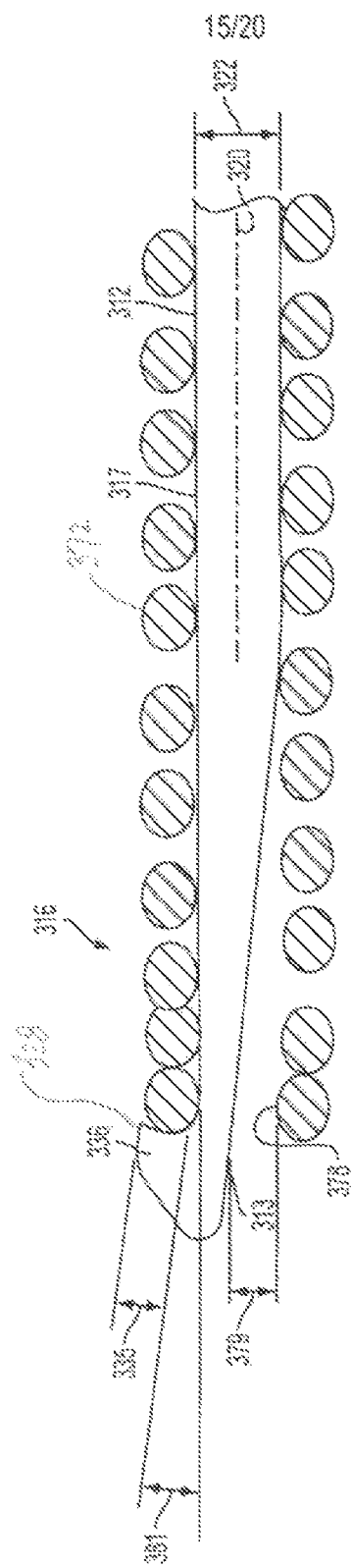
FIG. 15B illustrates a cross-sectional view of a test probe assembly according to one or more embodiments.
Figure 16:
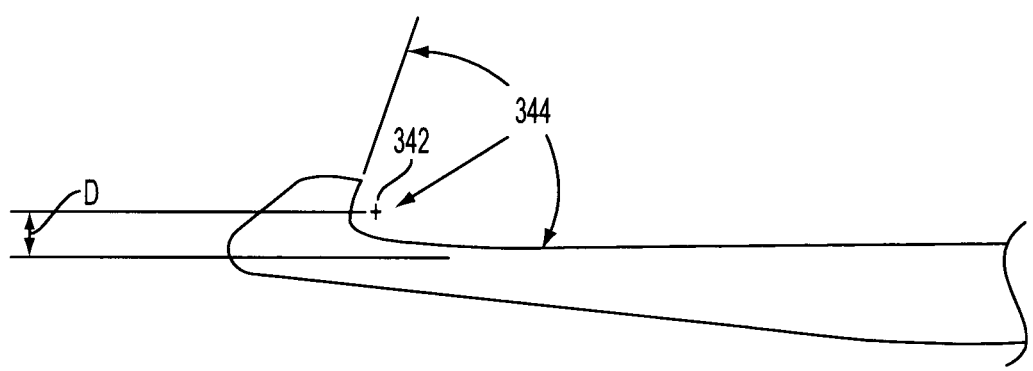
FIG. 16 illustrates a side view of a testing component of a test probe assembly in an uncompressed state according to one or more embodiments.

Referring to FIGS. 13 and 14, a test probe assembly 300, such as a testing apparatus, includes a test component 310, such as one or more plungers 312, 314, disposed within a spring component 370, such as a coiled wire 372 forming a spring. FIG. 13 shows the test probe assembly 300 in an uncompressed stated, where the hook catches over an end of the spring component 370, and FIG. 14 shows the test probe assembly 300 in a compressed state, and the hook is free.

Figure 18:
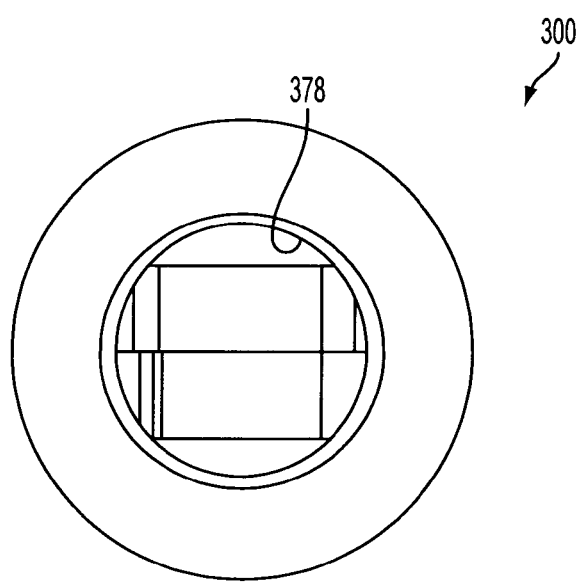
FIG. 18 illustrates a cross-sectional view of a test probe assembly in an uncompressed state according to one or more embodiments.

The spring component 370 extends from a first spring end portion 374 to a second spring end portion 376, and having an intermediate portion 375 therebetween. The spring component 370 is defined in part by an inner diameter 378 (FIG. 18) and an outer diameter 379. The spring component 370 is formed of a coiled wire 372 to form a spring. The coiled wire 372 is defined in part by a wire diameter 382. Within the inner volume of the spring, the plungers have enough room to slide freely with clearance.

Figure 17:
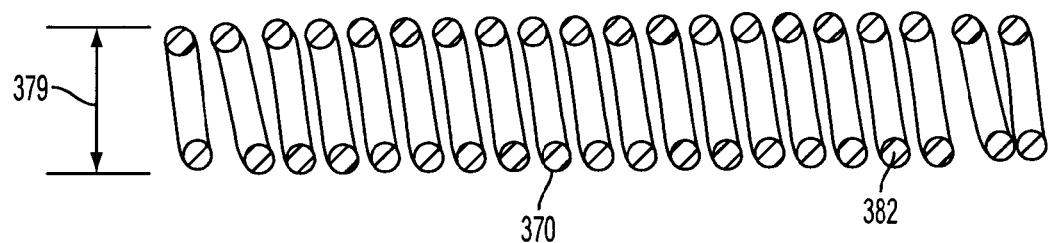
FIG. 17 illustrates a cross-sectional view of a spring component of a test probe assembly in an uncompressed state according to one or more embodiments.

In at least one embodiment, a coil of wire at the first spring end portion 374 and/or the second spring end portion 376 is has a smaller outer diameter than an adjacent coil. For instance, a coil of wire at the end of the spring component 370 has a smaller diameter than an outer diameter of the intermediate portion 375 of the spring, allowing for the test component 310 to be better coupled thereto when the testing component is not in a compressed state. In another example, end coils of the spring component 370 are wound such that at least one revolution of wire solidly contacts the next coil, forming a closed coil or a dead coil, as shown in FIG. 17. The end coils, in an embodiment, have a reduced diameter by at least ½ of the wire diameter 382.

Referring to FIGS. 13, 14, 15A, 15B, the test component 300 includes one or more elongate electrically conductive plungers, such as a first plunger 312 and optionally a second plunger 314. The first plunger 312 extends from a distal end portion 316 to a proximal end portion 317, and has an intermediate portion 317 therebetween. In one or more embodiments, two plungers are used within the spring component 370, and are disposed in opposite longitudinal orientations relative to one another.

The intermediate portion 317 has a central longitudinal axis 320, and is defined in part by an intermediate outer dimension 322. One or more of the plungers 312 includes a spring latch 330 such as a hook portion 331 disposed at the distal end portion 316. The distal end portion 316 has a distal outer dimension 328 at a base 332 of the hook portion 331. In an embodiment, the dimension 328 is disposed at a greater distance from the central longitudinal axis 320 than the outer dimension 322 of the intermediate portion 317 is disposed away from the axis 320 such that the hook portion 331 encompasses a portion of the coiled wire 372 when the testing component is in the uncompressed state. In another embodiment, the distal end portion 316 is disposed at an angle relative to the axis 320. For instance, the angle 381 (FIG. 15B) is about 15 degrees, allowing for the hook portion to encompass a portion of the wire 372 when the testing component is in the uncompressed state.

In one or more embodiments, the hook portion 331 is defined in part by a beak 336, and the beak 336 has a beak width 337 and a beak protrusion 335. In at least one embodiment, a distance is defined between an outer dimension 313 opposite the hook portion 331 and an inner diameter 378 of the spring component 370 defining a gap 379, and the distance of the gap 379 is greater than about a protrusion 335 of the beak 336. In one or more embodiments, the intermediate portion 317 is configured and sized to bias the hook portion 331 over the coiled wire when the testing apparatus is in an uncompressed state, and the hook portion 331 is free from the coiled wire when the testing apparatus is in a compressed state. For example, the distal portion of the plunger is at an angle to bias the plunger toward the spring.

In one or more embodiments, the intermediate portion outer dimension is about the same as the inner diameter 378 of the spring component 370. In one or more embodiments, the beak 336 has a beak width 337 (FIG. 15A) about 90% of the inner diameter 378 of the spring component 370. In one or more embodiments, the hook portion 331 is defined in part by a hook center 342, a dimension D is defined between the hook center 342 and the intermediate outer dimension, and D is greater than about ½ wire diameter. In at least one embodiment, the hook portion 331 includes an arc angle 344, where the arc angle is defined between a first hook portion 344 and an inner portion 348 of the outer dimension, the arc angle is less than 90 degrees.

Figure 19:
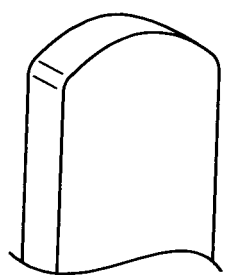
FIG. 19 illustrates a perspective view of a tip of a test probe assembly in an uncompressed state according to one or more embodiments.
Figure 20:
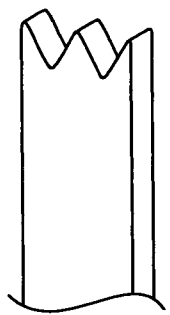
FIG. 20 illustrates a perspective view of a tip of a test probe assembly in an uncompressed state according to one or more embodiments.

FIGS. 19-24 illustrate a series of tips 399 for the testing component. The tips have a variety of geometries so that electrical contact can be optimized for reliability, depending on the type of surface that is contacted. Referring to FIG. 19, the tip 399 has a rounded, smoothly radiused tip that can be effectively used to contact a gold plated surface, such as a pad of a printed circuit board. FIG. 20 illustrates a tip 399 have three or more points. For instance, the three points are evenly spaced and are effective to use in contact with a gull-wing shaped semiconductor device lead.

Figure 21:
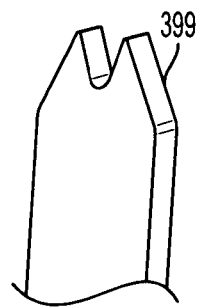
FIG. 21 illustrates a perspective view of a tip of a test probe assembly in an uncompressed state according to one or more embodiments.
Figure 22:
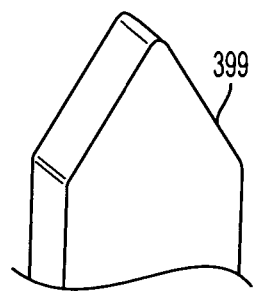
FIG. 22 illustrates a perspective view of a tip of a test probe assembly in an uncompressed state according to one or more embodiments.
Figure 23:
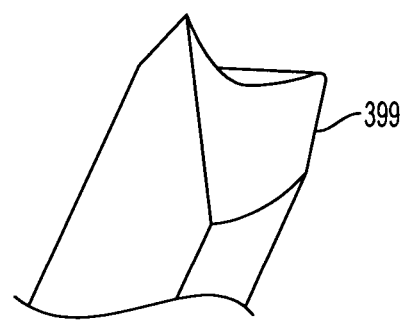
FIG. 23 illustrates a perspective view of a tip of a test probe assembly in an uncompressed state according to one or more embodiments.
Figure 24:
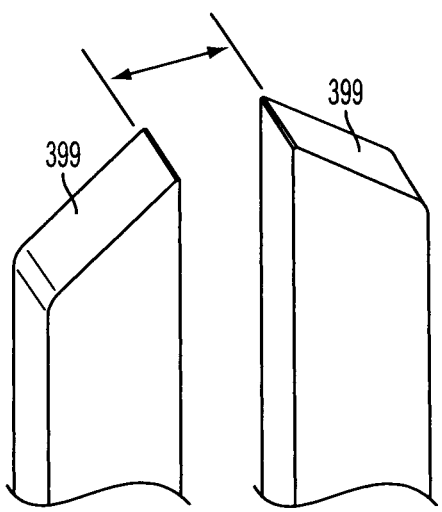
FIG. 24 illustrates a perspective view of a tip of a test probe assembly in an uncompressed state according to one or more embodiments.

Referring to FIG. 21, a dual sharp tip 399 is shown, and is used to contact a solder bump or sphere. FIG. 22 illustrates a generally triangular shaped tip to form a single point tip, which can be used to contact a flat pad semiconductor device lead plated, for instance with a non-noble metal plating. FIG. 23 illustrates another example of a tips, including a Y tip. The dual tips are very sharp that come to a 3D point, offset on each flast surface with a blended cove, used to contact a solder bump or sphere. Referring to FIG. 24, a pair of tips is provided, and the tips are offset from one another. The embodiment of FIG. 24 is used to contact a flat pad semiconductor device lead with two separate probes in order to accommodate a Kelvin connection. In an embodiment, the tips are triangular in shape, and the tips are disposed adjacent to one another, and the outer portions slope away from the central region.

A method includes using the test probe assembly, for example, within a testing apparatus. The method further or alternatively includes assembling a testing apparatus including the test probe assemblies discussed above. In an embodiment, the method includes disposing a first elongate electrically conductive plunger within a spring along a spring longitudinal axis, where the first plunger extends from a proximal first plunger end to a distal first plunger end and has a first intermediate portion therebetween. The first plunger has a spring latch at the distal first plunger end.

The method further includes disposing a second elongate electrically conductive plunger within the spring along the spring longitudinal axis, where the second elongate plunger extends from a proximal second plunger end to a distal second plunger end and has a second plunger spring latch at the distal second plunger end. The method further includes engaging the spring latch and the second plunger spring latch with the spring, for instance by capturing an end coil of the spring with the spring latch of at least one of the spring latch or the second plunger spring latch, or disposing the spring latch of at least one of the spring latch or the second plunger spring latch within a portion of the spring.

Several options for the method are as follows. The method optionally includes biasing at least one of the first or second plunger toward the spring latch or second plunger spring latch, respectively, with an inner diameter of the spring. The method further optionally includes compressing the first plunger toward the second plunger, and optionally expanding the spring, or compressing the spring. In yet another option, the method includes pivoting the first or second plunger toward the spring latch or second plunger spring latch, respectively. For instance, the inner diameter of the spring biases or pushes a portion of the plunger, causing the plunger to pivot and to engage at least a portion of the spring.

The geometry of the test probe assembly allows for ease of assembly, and an indication to the user of the proper orientation of the assembly. For example, the hook shapes of the latches for the spring eliminate the need for precisely matched tolerances for a press-fit interference assembly. The arc shape, which uses the internal diameter of the spring to maintain a lateral bias of the hook maintains the latching integrity of the assembly, and improves the electrical performance of the test probe assembly by providing a sliding contact of the plunger to the spring that improves electrical stability.

It is to be understood that the above description is intended to be illustrative, and not restrictive. Many other embodiments will be apparent to those of skill in the art upon reading and understanding the above description. It should be noted that embodiments discussed in different portions of the description or referred to in different drawings can be combined to form additional embodiments of the present application. The scope should, therefore, be determined with reference to the appended claims, along with the full scope of equivalents to which such claims are entitled.

The invention claimed is:

1. A testing apparatus comprising:
a spring component extending from a first spring end portion to a second spring end portion and having a spring intermediate portion, the spring intermediate portion having a spring inner diameter, the spring component including a coiled wire defined in part by a wire diameter, the spring component having a spring longitudinal axis;
at least one testing component including one or more elongate electrically conductive plungers, the one or more elongate electrically conductive plungers include a first plunger extending from a distal end portion to a proximal end portion and having an intermediate portion therebetween, the first plunger disposed within the spring component;
the intermediate portion of the first plunger having a central longitudinal axis, and defined in part by an intermediate outer dimension;
the first plunger including a spring latch, the spring latch including an arc-shaped hook portion disposed at the distal end portion; and
the distal end portion has a distal outer dimension at a base of the hook portion disposed at a greater distance from the central longitudinal axis than the intermediate outer dimension such that the hook portion is biased by the intermediate portion to encompass an outer portion of the coiled wire when the testing component is in an uncompressed state, the distal end portion has a distal longitudinal portion disposed at an obtuse angle with respect to the central longitudinal axis and the spring longitudinal axis.

2. The testing apparatus as recited in claim 1, wherein the hook portion is defined in part by a beak, and a distance between an outer dimension opposite the hook and an inner diameter of the spring component defining a gap, the distance greater than about a width of the beak.

3. The testing apparatus as recited in claim 1, wherein an intermediate portion is configured and sized to bias the hook over the coiled wire when the testing apparatus is in an uncompressed state, and the hook is free from the coiled wire when the testing apparatus is in a compressed state.

4. The testing apparatus as recited in claim 1, wherein the plunger has one or more of a three-pointed tip or a Y-shaped tip.

5. The testing apparatus as recited in claim 1, wherein the intermediate portion outer dimension is about the same as the inner diameter of the spring component.

6. The testing apparatus as recited in claim 1, wherein the beak portion has a hook width, wherein the hook width is about 90% of the inner diameter of the spring component.

7. The testing apparatus as recited in claim 1, wherein the hook portion is defined in part by a hook center, a dimension D is defined between the hook center and the intermediate outer dimension, and D is greater than about ½ wire diameter.

8. The testing apparatus as recited in claim 1, wherein the hook portion includes at least one arc defined in part by an arc angle defined between a first hook portion and an inner portion of the outer dimension, the arc angle is less than 90 degrees.

9. The testing apparatus as recited in claim 1, wherein an arc shape of the first plunger uses an internal diameter of the spring component to maintain a lateral bias of the hook portion.

10. A method comprising:
disposing one or more electronically conductive plungers within a spring along a spring longitudinal axis, the one or more electronically conductive plungers including a first plunger extending from a proximal first plunger end to a distal first plunger end and having an intermediate portion therebetween, the first plunger having a spring latch at the distal first plunger end, the spring latch having an arc shape, the spring having a spring longitudinal axis;
disposing a second plunger within the spring along the spring longitudinal axis, the second plunger extending from a proximal second plunger end to a distal second plunger end and having a second plunger spring latch at the distal second plunger end, the second plunger is elongate and electrically conductive, each plunger defined by a central longitudinal axis; and
engaging an outer portion of the spring with the spring latch and the second plunger spring latch by biasing the spring latch and the second plunger spring latch with intermediate portions of the spring latch and the second plunger spring latch, the first and second plungers each including a distal end portion that has a distal longitudinal portion disposed at an obtuse angle with respect to the central longitudinal axis and the spring longitudinal axis.

11. The method as recited in claim 10, wherein engaging the spring latch includes engaging the spring with a hook portion of the spring latch, wherein the distal end portion of the first plunger has a distal outer dimension at a base of the hook portion disposed at a greater distance from the central longitudinal axis than an outer dimension of the intermediate portion such that the hook portion encompasses a portion of the spring when the testing component is in an uncompressed state.

12. The method as recited in claim 10, further comprising biasing at least one of the first or second plunger toward the spring latch or second plunger spring latch, respectively, with an inner diameter of the spring.

13. The method as recited in claim 10, wherein engaging the spring latch and the second plunger spring latch with the spring includes capturing an end coil of the spring with the spring latch of at least one of the spring latch or the second plunger spring latch.

14. The method as recited in claim 10, wherein engaging the spring latch and the second plunger spring latch with the spring includes disposing the spring latch of at least one of the spring latch or the second plunger spring latch within a portion of the spring.

15. The method as recited in claim 10, further comprising compressing the first plunger toward the second plunger.

16. The method as recited in claim 15, further comprising pivoting the first or second plunger toward the spring latch or second plunger spring latch, respectively.

17. A test probe assembly comprising:
a first plunger extending from a proximal first plunger end to a distal first plunger end and having a distal end portion, the first plunger is elongate and electrically conductive, the first plunger having a first spring latch at the distal first plunger end, the first spring latch is arc shaped;

the first plunger defined in part by a central longitudinal axis;

at least a portion of the first plunger having an arc with a first plunger outer contact point opposite the first spring latch relative to the longitudinal axis;

the spring defined in part by an internal diameter, the first elongate plunger disposed within the spring; and the first plunger outer contact point in contact with the inner diameter of the spring and biases the first spring latch over and around an outer portion of the spring, and the first spring latch engages at least a portion of the spring, the distal end portion has a distal longitudinal portion disposed at an obtuse angle with respect to the central longitudinal axis and the spring longitudinal axis.

18. The test probe assembly as recited in claim 17, further comprising a second elongate plunger disposed within the spring, the second elongate plunger extending from a proximal second plunger end to a distal second plunger end and having an intermediate portion therebetween, the first elongate plunger slidably engaged with the second elongate plunger.

19. The test probe assembly as recited in claim 18, wherein the intermediate portion of the second plunger has an arc shape with a second plunger outer contact point, and the second plunger outer contact point in contact with the inner diameter of the spring.

20. The test probe assembly as recited in claim 18, wherein the distal first plunger end is disposed toward the proximal second plunger end, and the proximal first plunger end is disposed toward the distal second plunger end.

21. The test probe assembly as recited in claim 18, wherein the first plunger and the second plunger are substantially planer and are parallel with each other along their longitunal axes and their cross-sections.

22. The test probe assembly as recited in claim 1, wherein the first plunger includes an arc shape along the intermediate portion and the arc shape of the first plunger uses an internal diameter of the spring component to maintain a lateral bias of the hook portion.

* * * * *